(12) United States Patent
Imashiro et al.

(10) Patent No.: US 6,331,226 B1
(45) Date of Patent: Dec. 18, 2001

(54) LCP BONDING METHOD

(75) Inventors: Yasuo Imashiro; Hideshi Tomita; Takahiko Itoh; Norimasa Nakamura, all of Chiba (JP)

(73) Assignee: Nisshinbo Industries, Inc., Tokyo (JP)

( * ) Notice: Subject to any disclaimer, the term of this patent is extended or adjusted under 35 U.S.C. 154(b) by 0 days.

(21) Appl. No.: 09/577,395

(22) Filed: May 25, 2000

(30) Foreign Application Priority Data

Jun. 1, 1999 (JP) .................................................. 11-153878

(51) Int. Cl.$^7$ .................................................. C09J 163/02
(52) U.S. Cl. ..................... 156/330; 523/461; 525/452; 525/528; 528/59; 528/67
(58) Field of Search .................................... 156/330, 331.7; 523/461; 525/452, 528; 528/59, 67

(56) References Cited

FOREIGN PATENT DOCUMENTS

| 0 557 906 | 9/1993 | (EP) . |
|---|---|---|
| 0 991 306 | 4/2000 | (EP) . |
| 05 140431 | 6/1993 | (JP) . |
| 08 060133 | 3/1996 | (JP) . |
| 9-53000 | 2/1997 | (JP) . |

*Primary Examiner*—Robert Dawson
*Assistant Examiner*—D. Aylward
(74) *Attorney, Agent, or Firm*—Kirkpatrick & Stockton LLP

(57) ABSTRACT

A method for bonding LCPs mutually or an LCP and another material comprising the step of bonding LCPs mutually or an LCP and another material using an adhesive prepared by adding a polycarbodiimide resin with an epoxy resin composition comprising an epoxy resin and a curing agent, thereby providing excellent adhesion and heat resistance.

5 Claims, No Drawings

LCP BONDING METHOD

BACKGROUND OF THE INVENTION

1. Field of the Invention

The present invention relates to a method for bonding LCP and, more specifically, to a method for bonding LCP using an adhesive which has heat resistance and excellent adhesion to an LCP.

2. Description of the Related Art

An LCP (Liquid Crystalline Polymer) is attracting much attention even in the field of electronic materials because a highly elastic material is obtained when a molded product is produced therefrom and the LCP has high heat resistance and chemical resistance, due to the high crystallinity of the resin.

Meanwhile, an epoxy resin is widely used as a main raw material in the field of adhesives because a shrinkage of the epoxy resin is small when the epoxy resin is cured and it has excellent adhesion to metals.

However, it is known that a thermosetting adhesive typified by a general-purpose adhesive put on the market has poor adhesion to an LCP. For example, in case an LCP is used as a package material for electronic parts when the parts are mounted on a substrate, there is no thermosetting adhesive having sufficient strength obtained by bonding a substrate to a package. Therefore, its application field is very narrow at the moment.

In contrast to this, attempts have been made to enhance adhesion properties and improve bonding properties by the modification of an LCP itself (Japanese Patent Application Laid-open No. Hei 5-140431). However, this method in which 20 to 1 wt % of an alkylene ether is mixed on 80 to 99 wt % of an LCP impairs heat resistance that is one of the characteristic properties of the LCP and involves problems with solvent resistance and general applicability. Although the improvement of adhesion between an epoxy resin and an LCP by this modification is confirmed, thorough discussions have not been made on interface retention properties that is most important in adhesion between an adhesive and the LCP to be bonded. As an adhesive system having extremely low viscosity has been studied in the above application, the permeation of the adhesive into a molding resin is seen and it is considered that an anchoring effect is exhibited. However, the permeable adhesive is not preferred because it may change the characteristic properties of the LCP resin and the characteristic properties of internal electronic parts packaged with the LCP.

A method for bonding an LCP using a mechanical unit is also reported (Japanese Patent Application Laid-open No. Hei 5-177716). This method relates to a method in which the LCP is physically bonded by engaging or screwing. However, it is troublesome compared with a method using an adhesive, which is a defect of the method.

An adhesive having excellent thixotropic properties and low stringiness is reported, which is obtained by adding polycarbodiimide resin, water and a curing agent with an epoxy resin composition comprising an epoxy resin and a thixotrophy imparting agent and optionally a filler (Japanese Patent Application Laid-open No. Hei 9-53000). However, this publication doesn't say about its specific use and fails to disclose such an idea that it is an adhesive for an LCP.

SUMMARY OF THE INVENTION

It is an object of the present invention to provide a simple bonding method for obtaining a firmly bonding and adhesive site which have excellent adhesion properties to an LCP and excellent heat resistance.

The inventors of the present invention have conducted intensive studies to attain the above object, and have found out that an adhesive having excellent adhesion properties to an LCP can be obtained by adding and mixing a polycarbodiimide resin with an epoxy resin composition comprising an epoxy resin and a curing agent. Then the present invention has been accomplished based on this finding.

That is, the present invention provides a method for bonding LCPs mutually or an LCP and another material comprising the step of bonding the LCPs mutually or an LCP and another material using an adhesive prepared by adding a polycarbodiimide resin with an epoxy resin composition comprising an epoxy resin and a curing agent.

The present invention also provides an adhesive for an LCP which is prepared by adding a polycarbodiimide resin with an epoxy resin composition comprising an epoxy resin and a curing agent.

DETAILED DESCRIPTION OF THE PREFERRED EMBODIMENTS

A preferred embodiment of the present invention will be described hereinunder.

The method for bonding LCP of the present invention is characterized in that LCPs mutually or an LCP and another material are bonded together using an adhesive prepared by adding a polycarbodiimide resin with an epoxy resin composition comprising an epoxy resin and a curing agent. The adhesive used in this method is preferably an adhesive prepared by adding a polycarbodiimide resin with an epoxy resin composition comprising an epoxy resin and a curing agent and is produced without adding water.

The epoxy resin that can be used in the present invention includes a glycidyl ether type epoxy resin typified by a bisphenol A type epoxy resin, novolak type epoxy resin and cresol-novolak type epoxy resin, and an epoxy resin having at least one epoxy group in the molecule such as an alicyclic epoxy resin, heterocyclic epoxy resin or liquid rubber modified epoxy resin. Any resin called epoxy resin may be used in the present invention.

Out of these, the epoxy resin used in the present invention is preferably liquid at room temperature without a solvent, more preferably a bisphenol type epoxy resin.

Illustrative examples of the curing agent used in the present invention include acid anhydrides such as methyl nadic anhydride, dodecenylsuccinic anhydride, tetrahydrophthalic anhydride, hexahydrophthalic anhydride, methyl endomethylene tetrahydrophthalic anhydride, chlorendic anhydride, ethylene glycol trimellitic anhydride ester, methyl tetrahydrophthalic anhydride and methyl hexahydrophthalic anhydride; imidazole derivatives such as imidazole, 2-methylimidazole, 2-ethyl-4-methylimidazole, 2-phenylimidazole, 2-undecylimidazole, 2-heptadecylimidazole, 1-benzyl-2-methylimidazole, 1-cyanoethyl-2-methylimidazole, 1-cyanoethyl-2-phenylimidazole, 1-cyanoethyl-2-ethyl-4-methylimidazole, 1-cyanoethyl-2-methylimidazole trimellitate, 1-cyanoethyl-2-phenylimidazole trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-41-methylimidazolyl-(1)] ethyl-s-triazine and 1-dodecyl-2-methyl-3-benzoylimidazolium chloride; dicyandiamide or derivatives thereof; organic acid dihydrazides such as sebacic acid dihydrazide; urea derivatives such as 3-(3,4-dichlorophenyl)-1,1-dimethylurea;

polyamideamines, modified polyamines, boron fluoride -monoethylamine complexes and the like. Out of these, amine-based curing agents are preferred.

The amount of the curing agent may be suitably selected according to the type of curing agent used. It is generally 2 to 200 parts by weight based on 100 parts by weight of the epoxy resin. A curing accellorator may be used at this point, which can be easily presumed. They may be used alone or in combination of two or more.

The polycarbodiimide resin used in the present invention may be produced by a method such as a method disclosed in Japanese Patent Application Laid-open No. Sho 51-61599, the method of L. M. Alberino [J. Appl. Polym. Sci., 21, 1999 (1997)], or methods disclosed in Japanese Patent Application Laid-open No. Hei 2-292316 and Japanese Patent Application Laid-open No. Hei 6-56950. That is, the polycarbodiimide resin can be produced from an organic diisocyanate in the presence of a catalyst for promoting the carbodiimidation of the isocyanate.

The organic diisocyanate used in the production of the polycarbodiimide resin may be any type of aliphatic, alicyclic, aromatic or aromatic -aliphatic. These organic diisocyanates may be used solely or in combination of two or more.

The polycarbodiimide resin used in the present invention includes a homopolymer or copolymer comprising at least one repeating unit represented by the formula (I):
[formula 1]

—R—N=C=N— (I)

wherein R is a divalent organic group from organic diisocyanate.

Illustrative examples of the organic diisocyanate corresponding to R include 2,4-tolylene diisocyanate, 2,6-tolylene diisocyanate, a mixture of 2,4- and 2,6-tolylene diisocyanates, crude tolylene diisocyanate, crude diphenylmethane diisocyanate, 4,4',4"-triphenylmethylene triisocyanate, xylylene diisocyanate, hexamethylene-1,6-diisocyanate, lysine diisocyanate, hydrogenated diphenylmethane diisocyanate, isophorone diisocyanate, tetramethyl xylylene diisocyanate, 4,4'-biphenylene diisocyanate, diphenylmethane diisocyanate, 3,3'-dimethylphenylmethane-4,4'-diisocyanate, 3,3'-dimethyldiphenyl-4,4'-diisocyanate and mixtures thereof.

The above polycarbodiimide resin may be a polycarbodiimide resin having an isocyanate group itself at a terminal or may be treated by capping the terminal with a compound having one selected from a monoisocyanate, —NH$_2$, —NHR (where R is an alkyl group), —COOH, —SH and —OH groups or an acid anhydride to control its molecular weight in compliance with use.

The polycarbodiimide resin used in the present invention is not particularly limited as described above, but it is preferably a polycarbodiimide resin of being mixed with an epoxy resin easily, particularly preferably a polycarbodiimide resin in the form of a powder or liquid. The amount of the polycarbodiimide resin is 0.1 part or more by weight and 10 parts or less by weight based on 100 parts by weight of the epoxy resin composition comprising the epoxy resin and the curing agent. When the amount is 0.1 part or more by weight, a sufficient effect is obtained and when the amount is 10 parts or less by weight, it is easy to control the viscosity and reactivity of the adhesive.

The adhesive of the present invention may contain a thixotrophy imparting agent, filler or coupling agent as required.

Well known thixotrophy imparting agents may be used, and examples of these include inorganic fine particles such as powder silica, calcium carbonate and bentonite; and organic materials such as polycarboxylic acid, castor oil derivatives and polyamide-based wax.

The term "filler" is used as a concept, including not only powder fillers but also flame retardants and colorants. Stated more specifically, the powder fillers include crystalline silica, molten silica, calcium carbonate, talc, mica, alumina, aluminum hydroxide, white carbon, carbon black, expanded graphite powders and powdery graphite. The flame retardants include powdery organic halogen compounds, red phosphorus and antimony trioxide. The colorants include pigments and dyes of various kinds. These fillers may be selected and used according to purpose.

Illustrative examples of the coupling agent include silane-based coupling agents such as γ-methacryloxypropyl trimethoxysilane, β-(3,4-epoxycyclohexyl)trimethoxysilane and γ-aminopropyl triethoxysilane; and titanium-based coupling agents such as tetraisopropyl titanate and titanium acylate.

Water may be adsorbed to the thixotrophy imparting agent or filler, therefore the adhesive of the present invention may contain water. In case that the amount of water is very small, there is no problem. However, to bond an LCP effectively, it is preferred that the content of water in the adhesive should be small and that water should not be added during the production.

Preferably, the adhesive is produced without adding water and the content of water is preferably 0.5 wt % or less, more preferably 0.3 wt % or less based on the total weight of the adhesive.

As a method to add the polycarbodiimide resin with an epoxy resin composition comprising an epoxy resin and a curing agent, when the polycarbodiimide resin is solid, it may be illustlated general method to powder them and uniformly disperse with a kneader such as a three-roll mill. The epoxy resin composition may be melt and kneaded using a melt kneader such as a Banbury mixer or rubber roll machine. The polycarbodiimide resin prepared in the form of a solution using a soluble solvent may be kneaded with the epoxy resin composition and then the solvent may be removed therefrom.

When the polycarbodiimide resin is liquid, it can be directly mixed with and dispersed into the epoxy resin composition.

The adhesive of the present invention is cured at 130 to 200° C. for 1 to 180 minutes, preferably 150 to 180° C. for 10 to 30 minutes when dicyandiamide which is a potential curing agent is used. Since the epoxy adhesive has sufficient adhesion strength and reflow soldering heat resistance and further has no metal corrosiveness after curing, it is suitably used for electronic parts to bond LCPs mutually, an LCP and a metal, or an LCP and resin.

The LCP applicable to the present invention is not particularly limited to, and includes thermotropic LCP and all kinds of conventionally well known LCP. The thermotropic LCP include aromatic polyester LCP which are synthesized from a monomer such as an aromatic diol, aromatic carboxylic acid or hydroxycarboxylic acid and which shows liquid crystallinity when molten. Typical thermotropic LCP include LCP of a first type which comprises parahydroxybenzoic acid (PHB), terephthalic acid and biphenol (following formula II), LCP of a second type which comprises PHB and 2,6-hydroxynaphthoic acid (following formula III), and LCP of a third type which comprises PHB, terephthalic acid and ethylene glycol (following formula IV).

[formula 2]

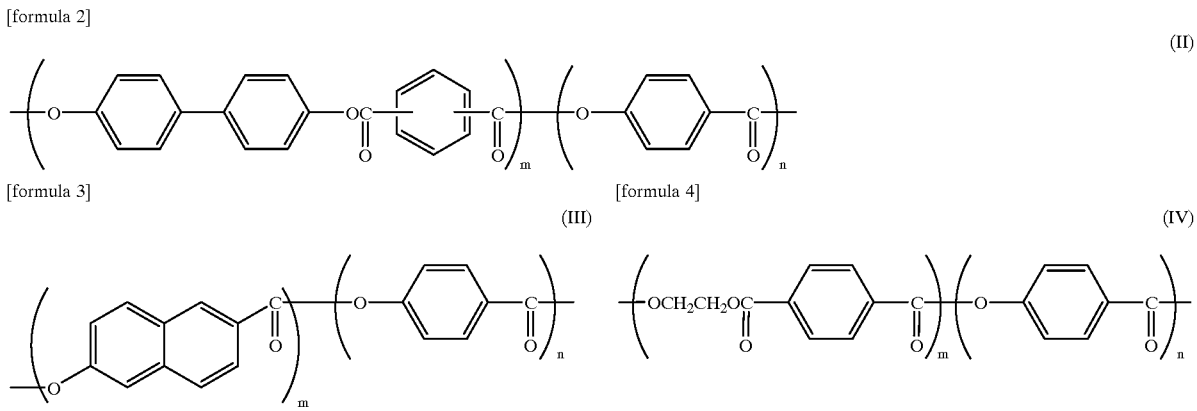

[formula 3]

[formula 4]

These LCP may contain a filler such as glass fibers, carbon fibers, silica, alumina, titania or zirconia, flame retardant and plasticizer in suitable amounts. Illustrative examples of the LCP in the present invention are enumerated above but the present invention is not limited to these.

Other materials which can be bonded to the LCP with the adhesive of the present invention include a material which is generally used as an electronic part, such as a metal or resin. The metal is exemplified by copper, aluminum, stainless steel, silver or the like. The resin is exemplified by an epoxy resin, phenolic resin, polyester resin, polyimide resin, polyamide resin or the like.

The following examples are given to further illustrate the present invention.

EXAMPLE 1

(1) Synthesis of Carbodiimide 180 g of MDI, 20 g of PhI, 600 g of THF, 600 g of ethyl acetate and 0.4 g of 1-phenyl-3-methyl-2-phosphorene-1-oxide as a carbodiimidation catalyst were charged into a 2-liter flask having a cooling tube and stirrer, allowed to react under reflux for 5 hours and cooled to precipitate powders. The powders were extracted by filtration and vacuum dried to obtain carboxyimide resin 1.

(2) Production of Adhesive

To 100 parts by weight of a bisphenol A type epoxy resin (Epicoat 828 of Yuka Shell Co., Ltd.), 8.2 parts by weight of dicyandiamide, 2 parts by weight of an imidazole (Cuazole 2PZ-CNS of Shikoku Kasei Co., Ltd.), 20 parts by weight of calcium carbonate and 3 parts by weight of colloidal silica (Aerogel 300 of Nippon Aerogel Co., Ltd.) were added. Thereto 10 parts by weight of the carbodiimide resin 1 was added and uniformly mixed using a three-roll mill to obtain adhesive composition 1.

EXAMPLE 2

(1) Synthesis of Carbodiimide 500 g of hydrogenated MDI and 8 g of a carbodiimidation catalyst were charged into the same apparatus as in (1) of Example 1 and allowed to react at 180° C. for 18 hours, and the obtained product was cooled and milled to obtain powdery carbodiimide resin 2.

(2) Production of Adhesive

Adhesive composition 2 was obtained in the same manner as in (2) of Example 1 except that 5 parts by weight of the carbodiimide resin 2 was used.

EXAMPLE 3

(1) Synthesis of Carbodiimide 500 g of tetramethylxylylene diisocyanate (TMXDI) and 9.2 g of carbodiimidation catalyst were charged into the same apparatus as in (1) of Example 1 and allowed to react at 180° C. for 20 hours while nitrogen was bubbled to obtain paste carbodiimide resin 3.

(2) Production of Adhesive

Adhesive composition 3 was obtained in the same manner as in (2) of Example 1 except that 3 parts by weight of the carbodiimide resin 3 was used.

COMPARATIVE EXAMPLE 1

Adhesive composition 4 was obtained in the same manner as in (2) of Example 1 except that a carbodiimide resin was excluded.

EXAMPLE 4

<Testing Method>

An ASTM1 dumbbell-like molded product of an LCP (Vectora E130 of Polyplastic Co., Ltd.) was divided into two pieces, and the pieces were coated with the adhesive composition obtained by the above method and cured by heating to bond together so as to prepare a test piece. The bonding area of the produced test piece was 19.0×12.5 mm. The heat treatment was carried out at 150° C. for 30 minutes.

The thus produced test piece was subjected to a tensile shear test and a value obtained by dividing the maximum load value at the time of breaking by the bonding area was taken as tensile shear adhesive force.

The state of the bonding surface after breaking was observed and evaluated based on the following three modes.
(1) Breakage starts from the interface between the adhesive and the LCP: breakage of interface
(2) The interface is maintained but the LCP layer breaks: breakage of base material
(3) The interface is maintained but the adhesive resin layer breaks: breakage of aggregation The results are shown in Table 1.

TABLE 1

| Adhesive | Tensile shear adhesive strength kgf/cm$^2$ | Breaking mode |
| --- | --- | --- |
| Example 1 (adhesive composition 1) | 57.5 | Breakage of base material |

TABLE 1-continued

| Adhesive | Tensile shear adhesive strength kgf/cm$^2$ | Breaking mode |
| --- | --- | --- |
| Example 2 (adhesive composition 2) | 63.5 | Breakage of base material |
| Example 3 (adhesive composition 3) | 62.3 | Breakage of base material |
| Comparative Example 1 (adhesive composition 4) | 25 | Breakage of interface |

As shown in the table, it is understood that an adhesive obtained by adding the carbodiimide resin with the epoxy resin shows excellent adhesion to the LCP.

According to the present invention, the adhesive can exhibit excellent adhesion to the LCP, which has been difficult to be bonded, and a firm bonding site can be obtained by a simple method. An excellent bonding site can be maintained without improving an LCP itself, thereby preventing deterioration in the physical properties such as heat resistance of the LCP.

Further, the present invention makes it possible to expand the application field of an LCP, for example, a ceramic substitute.

This invention being thus described, it will be obvious that the same may be varied in various ways. Such variations are not to be regarded as departure from the spirit and scope of the invention, and all such modifications would be obvious for one skilled in the art intended to be included within the scope of the following claims.

What is claimed is:

1. A method for bonding LCPs mutually or an LCP and another material comprising the step of bonding the LCPs or LCP and another material using an adhesive prepared by adding a polycarbodiimide resin with an epoxy resin composition comprising an epoxy resin and a curing agent.

2. The method according to claim 1, wherein the amount of the curing agent is 2 to 200 parts by weight based on 100 parts by weight of the epoxy resin.

3. The method according to claim 1 or 2, wherein the amount of the polycarbodiimide resin added is 0.1 to 10 parts by weight based on 100 parts by weight of the epoxy resin composition comprising the epoxy resin and the curing agent.

4. An adhesive for LCP which is prepared by adding a polycarbodiimide resin with an epoxy resin composition comprising an epoxy resin and a curing agent.

5. The adhesive according to claim 4 which has a water content of 0.5 wt % or less.

* * * * *